United States Patent
Gotoh et al.

(10) Patent No.: US 12,148,616 B2
(45) Date of Patent: Nov. 19, 2024

(54) LASER ANNEALING METHOD, LASER ANNEALING DEVICE, AND CRYSTALLIZED SILICON FILM SUBSTRATE

(71) Applicant: V TECHNOLOGY CO., LTD., Kanagawa (JP)

(72) Inventors: Jun Gotoh, Kanagawa (JP); YingBao Yang, Kanagawa (JP); Michinobu Mizumura, Kanagawa (JP); Yoshihiro Shioaku, Kanagawa (JP)

(73) Assignee: V TECHNOLOGY CO., LTD., Yokohama (JP)

( * ) Notice: Subject to any disclaimer, the term of this patent is extended or adjusted under 35 U.S.C. 154(b) by 660 days.

(21) Appl. No.: 17/421,325

(22) PCT Filed: Jan. 16, 2020

(86) PCT No.: PCT/JP2020/001346
§ 371 (c)(1),
(2) Date: Jul. 7, 2021

(87) PCT Pub. No.: WO2020/158424
PCT Pub. Date: Aug. 6, 2020

(65) Prior Publication Data
US 2022/0005692 A1 Jan. 6, 2022

(30) Foreign Application Priority Data
Jan. 31, 2019 (JP) .................. 2019-015656

(51) Int. Cl.
*C30B 1/06* (2006.01)
*B23K 26/00* (2014.01)
(Continued)

(52) U.S. Cl.
CPC .... *H01L 21/02691* (2013.01); *B23K 26/0006* (2013.01); *B23K 26/0604* (2013.01);
(Continued)

(58) Field of Classification Search
CPC ........... C30B 1/023; C30B 1/06; B23K 26/53; B23K 26/006; B23K 26/0604;
(Continued)

(56) References Cited

U.S. PATENT DOCUMENTS

| 6,730,550 B1 | 5/2004 | Yamazaki et al. |
| 2002/0004292 A1 | 1/2002 | Yamazaki et al. |

(Continued)

FOREIGN PATENT DOCUMENTS

| JP | 2000-260709 A | 9/2000 |
| JP | 2001-144027 A | 5/2001 |

(Continued)

OTHER PUBLICATIONS

International Search Report for PCT/JP2020/001346 dated Mar. 24, 2020, 7 pages.

(Continued)

*Primary Examiner* — Robert M Kunemund
(74) *Attorney, Agent, or Firm* — Rothwell, Figg, Ernst & Manbeck, P.C.

(57) ABSTRACT

A first laser irradiation, in which an amorphous silicon film is irradiated with a first laser beam for transformation of the amorphous silicon film to a microcrystalline silicon film, and a second laser irradiation, in which a second laser beam moves along a unidirectional direction with the microcrystalline silicon film as a starting point for lateral crystal growth of growing crystals constituting a crystallized silicon film, are carried out to form a microcrystalline silicon film and a crystallized silicon film alternately along the unidirectional direction.

7 Claims, 10 Drawing Sheets

(51) Int. Cl.
    *B23K 26/06*     (2014.01)
    *B23K 26/53*     (2014.01)
    *H01L 21/02*     (2006.01)
    *H01L 29/04*     (2006.01)
    *B23K 103/00*     (2006.01)

(52) U.S. Cl.
    CPC ........ *B23K 26/53* (2015.10); *H01L 21/02678* (2013.01); *H01L 21/02683* (2013.01); *H01L 21/02686* (2013.01); *H01L 29/04* (2013.01); *B23K 2103/56* (2018.08)

(58) Field of Classification Search
    CPC ......... H01L 21/02691; H01L 21/02678; H01L 21/02683; H01L 21/2686; H01L 29/04
    See application file for complete search history.

(56) References Cited

U.S. PATENT DOCUMENTS

| | | |
|---|---|---|
| 2002/0048864 A1 | 4/2002 | Yamazaki et al. |
| 2002/0094639 A1* | 7/2002 | Reddy ............... G06K 19/07749 438/257 |
| 2002/0168577 A1* | 11/2002 | Yoon ................... H01L 21/0268 430/394 |
| 2003/0141505 A1 | 7/2003 | Isobe et al. |
| 2003/0141521 A1 | 7/2003 | Isobe et al. |
| 2003/0193068 A1 | 10/2003 | Yeh |
| 2003/0218171 A1 | 11/2003 | Isobe et al. |
| 2004/0224449 A1 | 11/2004 | Yamazaki et al. |
| 2005/0169330 A1 | 8/2005 | Hongo et al. |
| 2005/0272185 A1 | 12/2005 | Seki et al. |
| 2006/0019474 A1* | 1/2006 | Inui .................... B23K 26/0608 257/E29.292 |
| 2006/0186415 A1* | 8/2006 | Asano ................. H01L 27/1281 257/72 |
| 2007/0015323 A1 | 1/2007 | Isobe et al. |
| 2007/0085080 A1 | 4/2007 | Isobe et al. |
| 2007/0148925 A1 | 6/2007 | Yamazaki et al. |
| 2008/0050893 A1* | 2/2008 | Shimmoto ........ H01L 21/02683 257/E21.498 |
| 2008/0084901 A1 | 4/2008 | Inui et al. |
| 2011/0121305 A1* | 5/2011 | Tseng ................ H01L 29/78618 438/479 |
| 2011/0300676 A1 | 12/2011 | Schroder et al. |
| 2016/0343569 A1 | 11/2016 | Mazzamuto |

FOREIGN PATENT DOCUMENTS

| | | |
|---|---|---|
| JP | 2002-313724 A | 10/2002 |
| JP | 2003-297751 A | 10/2003 |
| JP | 2004-63478 A | 2/2004 |
| JP | 2005-347694 A | 12/2005 |
| JP | 2006-156676 A | 6/2006 |
| JP | 2006-165463 A | 6/2006 |
| JP | 2008-053394 A | 3/2008 |
| JP | 2008-218493 A | 9/2008 |
| JP | 2014-505348 A | 2/2014 |
| KR | 10-2006-0046751 A | 5/2006 |
| TW | 201539545 A | 10/2015 |

OTHER PUBLICATIONS

Office Action mailed May 31, 2022 in corresponding Japanese Patent Application No. 2019-015656 (with an English translation) (12 pages).

Office Action mailed Jul. 7, 2023 in corresponding Taiwanese Patent Application No. 109102138 (with an English translation) (11 pages).

Decision of Rejection mailed Nov. 28, 2023 in corresponding Taiwanese Patent Application No. 109102138 (with an English translation) (11 pages).

Office Action mailed Oct. 25, 2022 in corresponding Japanese Patent Application No. 2019-015656 (with an English translation) (6 pages).

Office Action mailed Mar. 19, 2024 in corresponding Korean Patent Application No. 10-2021-7023901 (with an English translation) (22 pages).

* cited by examiner

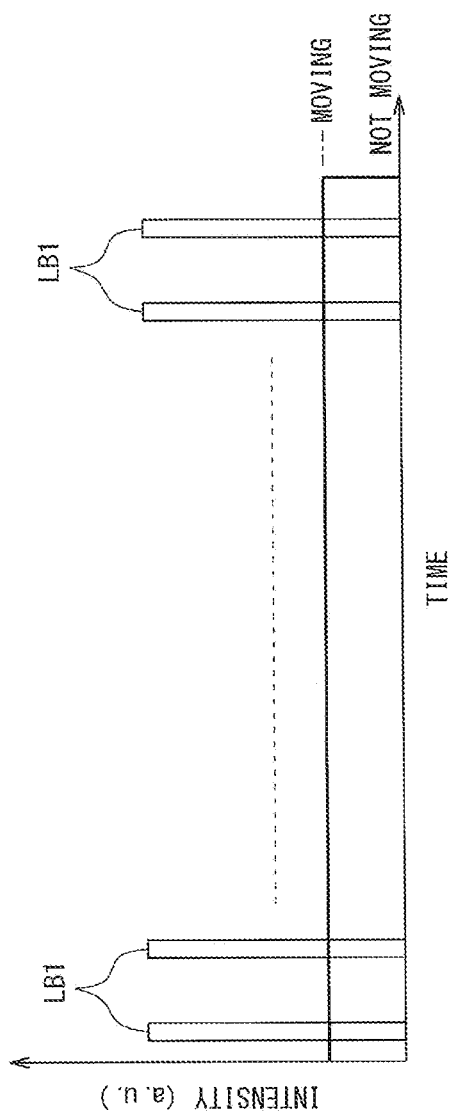
F I G. 8A
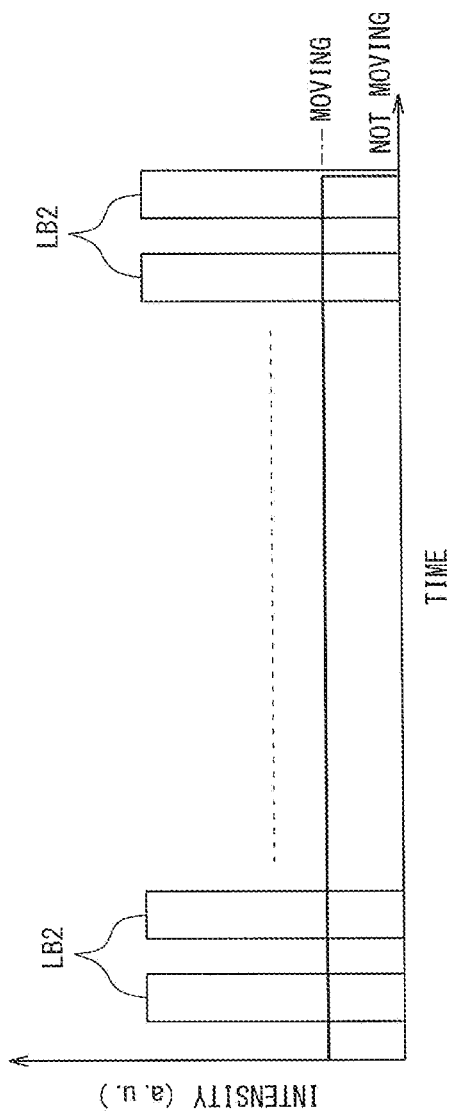
F I G. 8B

LASER ANNEALING METHOD, LASER ANNEALING DEVICE, AND CRYSTALLIZED SILICON FILM SUBSTRATE

CROSS REFERENCE TO RELATED APPLICATION

This application is a 35 U.S.C. 371 National Phase Entry Application from PCT/JP2020/001346, filed Jan. 16, 2020, which claims priority to Japanese Application No. 2019-015656, filed Jan. 31, 2019, the disclosures of which are incorporated herein in their entirety by reference, and priority is claimed to each of the foregoing.

TECHNICAL FIELD

The present invention relates to a laser annealing method, a laser annealing device and a crystallized silicon film substrate.

BACKGROUND

A thin-film transistor (TFT) is used as a switch-device attached to each pixel to actively maintain the pixel state while other pixels are being addressed in a flat panel display (FPD). Amorphous silicon (a-Si) or polycrystalline silicon (p-Si) or the like is being used as a parent material for semiconductor layers of TFTs.

Amorphous silicon is low in mobility, i.e., a semiconductor parameter how quickly an electron can move through a semiconductor. It follows that amorphous silicon cannot meet high mobility needed as a parent material for high-density and high resolution FPDs. Since the mobility of polycrystalline silicon is significantly higher than that of amorphous silicon, polycrystalline silicon is preferable as a parent material for forming a channel of each switch element used in FPDs. As a known method of forming a polycrystalline silicon film, there is a laser anneal in which an excimer laser annealing (ELA) device incorporating an excimer laser irradiates amorphous silicon with a laser beam to crystallize amorphous silicon to produce polycrystalline silicon.

As one of conventional laser annealing methods, an excimer laser anneal (ELA) is known (see Patent Literature 1), in which a target region is irradiated with a pulsed laser derived from a laser beam emitted by an excimer laser.

With this known laser anneal, irradiation with a high intensity pulsed laser beam is followed by irradiation with a low intensity pulsed laser beam for crystallization of a residual poor crystallization part after the irradiation with the high intensity pulsed laser.

As another conventional laser annealing method, it is proposed to optimize the intensity distribution of a pulsed laser beam derived from a laser beam emitted by an excimer laser along the direction in which the irradiation with the pulsed laser beam progresses.

PRIOR ART

Patent Literature

Patent Literature 1: JP2002-313724 A

SUMMARY OF THE INVENTION

Problem to be Solved by the Invention

With the laser annealing method disclosed in the above-mentioned Patent Literature 1, the grain size of the polycrystalline silicon grown after irradiation with a pulsed laser beam derived from a laser beam emitted by an excimer laser ranges from some tens to 350 nm. The polycrystalline silicon with such a grain size cannot meet demand for higher mobility. However, along with growing demand for increased size of, high resolution of, and improved characteristics of video streams like increased frame rate of an FPD, the high mobility in the channel semiconductor layer of a TFT that serves as a switch-device is demanded.

In view of the above-mentioned problem, an object of the present invention is to provide a laser annealing method, a laser annealing device, and a crystallized silicon film substrate capable of accomplishing crystal growth to form a crystallized silicon film like a pseudo-single crystalline silicon film with high mobility while suppressing the occurrence of variations in semiconductor characteristics.

Means for Solving the Problem

In order to solve the above-mentioned problem and to accomplish the object, there is provided, according to one aspect of the present invention, a laser annealing method for forming a crystallized silicon film after lateral crystal growth of growing crystals in an amorphous silicon film with a technique of moving a laser beam relative to the amorphous silicon film in a unidirectional direction, including: a first laser beam irradiation of irradiating the amorphous silicon film with a first laser beam for transformation of the amorphous silicon film to a microcrystalline silicon film, and a second laser beam irradiation of carrying out irradiation of a region reserved for the lateral crystal growth of growing crystals with a second laser beam along the unidirectional direction with the microcrystalline silicon film as a starting point for lateral crystal growth of growing crystals constituting the crystallized silicon film, forming the microcrystalline silicon film and the crystallized silicon film alternately along the unidirectional direction.

According to the above-mentioned aspect, it is preferable that, at a minimum, a region reserved for the transformation to the microcrystalline silicon film is irradiated with the first laser beam, and only the region reserved for the lateral crystal growth of growing crystals is irradiated with the second laser beam during movement of the second laser beam along the unidirectional direction relative to the amorphous silicon film.

According to the foregoing aspect, it is preferred that the amorphous silicon film is irradiated with the first laser beam to continuously transform the amorphous silicon film to the microcrystalline silicon film along the unidirectional direction, and the irradiation with the second laser beam with the microcrystalline silicon film as a starting point is interruptedly carried out along the unidirectional direction.

According to the foregoing aspect, it is preferred that the crystallized silicon film includes an area reserved for a semiconductor element.

According to the foregoing aspect, it is preferred that the first laser beam and the second laser beam are pulse width modulated.

According to the foregoing aspect, it is preferred that the first laser beam and the second laser beam have different modulation frequencies.

According to the foregoing aspect, it is preferred that the first laser beam is a pulsed laser beam, and the second laser beam is a continuous wave laser beam.

According to the foregoing aspect, it is preferred that the length parallel to the unidirectional direction of the crystallized silicon film is not greater than 50 μm.

There is provided, according to further aspect of the present invention, a laser annealing device for forming a crystallized silicon film after lateral crystal growth of growing crystals in an amorphous silicon film with a technique of moving a laser beam relative to the amorphous silicon film in a unidirectional direction, including: a first laser beam output stage operative to irradiate the amorphous silicon film with a first laser beam for transformation of the amorphous silicon film to a microcrystalline silicon film, a second laser beam output stage operative to carry out irradiation of a region reserved for the lateral crystal growth of growing crystals with a second laser beam along the unidirectional direction with the microcrystalline silicon film as a starting point for lateral crystal growth of growing crystals constituting the crystallized silicon film, and a controller configured to cause the first laser beam output stage and the second laser beam output stage to operate in a way to form the microcrystalline silicon film and the crystallized silicon film alternately along the unidirectional direction.

According to the above-mentioned further aspect, it is preferred that the first laser beam output stage is switched ON to irradiate, at a minimum, a region reserved for the transformation to the microcrystalline silicon film with the first laser beam, and the second laser beam output stage is switched ON to irradiate only the region reserved for the lateral crystal growth of growing crystals with the second laser beam during movement of the second laser beam along the unidirectional direction relative to the amorphous silicon film.

According to the foregoing further aspect, it is preferred that the first laser beam output stage is continuously switched ON to irradiate the amorphous silicon film with the first laser beam along the unidirectional direction, and the second laser beam output stage is interruptedly switched ON to carry out the irradiation with the second laser beam along the unidirectional direction.

According to the foregoing further aspect, it is preferred that the crystallized silicon film includes an area reserved for a semiconductor element.

According to the foregoing further aspect, it is preferred that the first laser beam and the second laser beam are pulse width modulated.

According to the foregoing further aspect, it is preferred that the first laser beam and the second laser beam have different modulation frequencies.

According to the foregoing further aspect, it is preferred that the first laser beam is a pulsed laser beam, and the second laser beam is a continuous wave laser beam.

According to the foregoing further aspect, it is preferred that the length parallel to the unidirectional direction of the crystallized silicon film is not greater than 50 µm.

There is provided, according to other aspect of the present invention, a crystallized silicon film substrate in which a microcrystalline silicon film region and a crystallized silicon film region are formed on the surface of the substrate alternately along a unidirectional direction.

According to the above-mentioned other aspect, it is preferred that the length parallel to the unidirectional direction of the crystallized silicon film is not greater than 50 µm.

According to the foregoing other aspect, it is preferred that the crystallized silicon film includes an area reserved for a semiconductor element.

TECHNICAL EFFECTS OF THE INVENTION

The present invention provides a laser annealing method, a laser annealing device, and a crystallized silicon film substrate capable of accomplishing crystal growth to form a crystallized silicon film like a pseudo-single crystalline silicon film with high mobility while suppressing the occurrence of variations in semiconductor characteristics.

BRIEF DESCRIPTION OF THE DRAWINGS

FIG. 3A The intensity profile along a line passing through a rectangle-shape beam spot of each of the first and second laser beams in the transverse direction perpendicular to the scan-movement direction of the beam spots. FIG. 3B) The intensity profile along a line passing through the beam spots of the first and second laser beams in the scan-movement direction of the beam spots.

FIG. 8A and FIG. 8B illustrative diagram of the operation of a laser annealing method according to further embodiment of the present invention, FIG. 8A showing the timing of laser irradiation of a workpiece with a first laser beam as well as whether the workpiece is moving, and FIG. 8B showing the timing of laser irradiation of the workpiece with a second laser beam as well as whether the workpiece is moving.

MODE FOR CARRYING OUT THE INVENTION

A laser annealing method, a laser annealing device, and a crystallized silicon film substrate, which are according to embodiments of the present invention, are described below using the accompanying drawings which are schematic.

(Laser Annealing Device)

Figure 1:
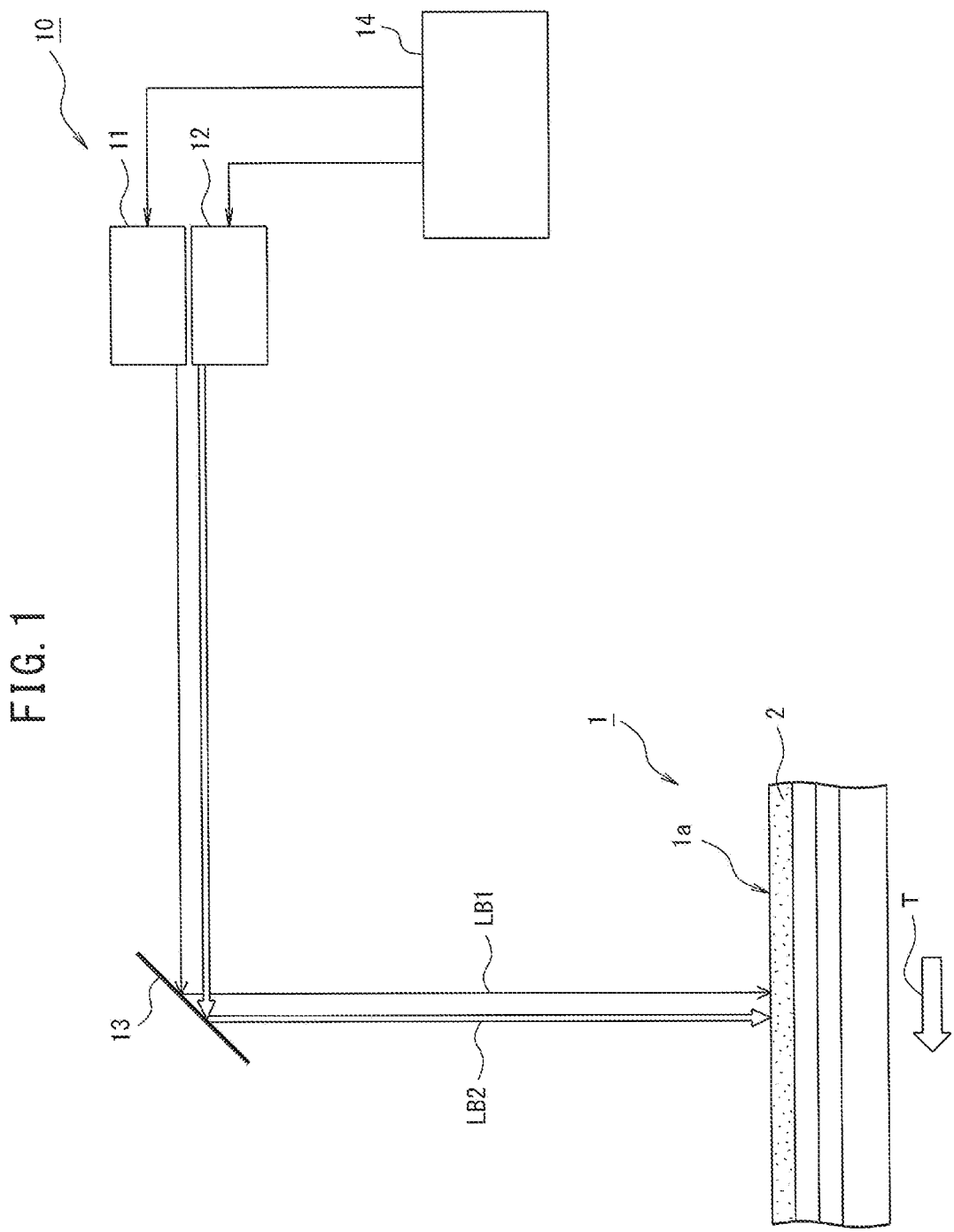
FIG. 1 is a schematic diagram of a laser annealing device according to one embodiment of the present invention.

Referring to FIG. 1, the configuration of a laser annealing device 10 according to an embodiment of the present invention is described. As depicted in FIG. 1, the laser annealing device 10 includes: a system, not illustrated, for transporting a workpiece 1 in a transport direction T (a direction in which the workpiece 1 moves); a first laser beam output stage 11 operative when switched ON to emit a first laser beam LB1, which is a pulsed laser beam; a second laser beam output stage 12, e.g., a semiconductor laser, operative when switched ON to emit a second laser beam LB2, which is a continuous-wave (cw) laser beam; a reflector 13; and a controller 14. The controller 14 is configured to switch ON or OFF the first laser beam output stage 11 and the second laser beam output stage 12 at appropriate timings, which are adjustable. In the present embodiment, the workpiece 1 includes panel regions 1a as depicted in FIG. 2.

The term "cw laser beam" is herein used to include the concept of a laser beam emitted by a quasi-continuous-wave (quasi-cw) operation, which is adjusted to continuously irradiate a target region. In other words, a laser beam may be emitted by a pulsed operation or a quasi-cw operation that allows a pulse interval shorter than the cooling time of a silicon thin film (amorphous silicon film) after being heated so that the silicon film can be irradiated with the next pulse before solidifying.

Figure 2:
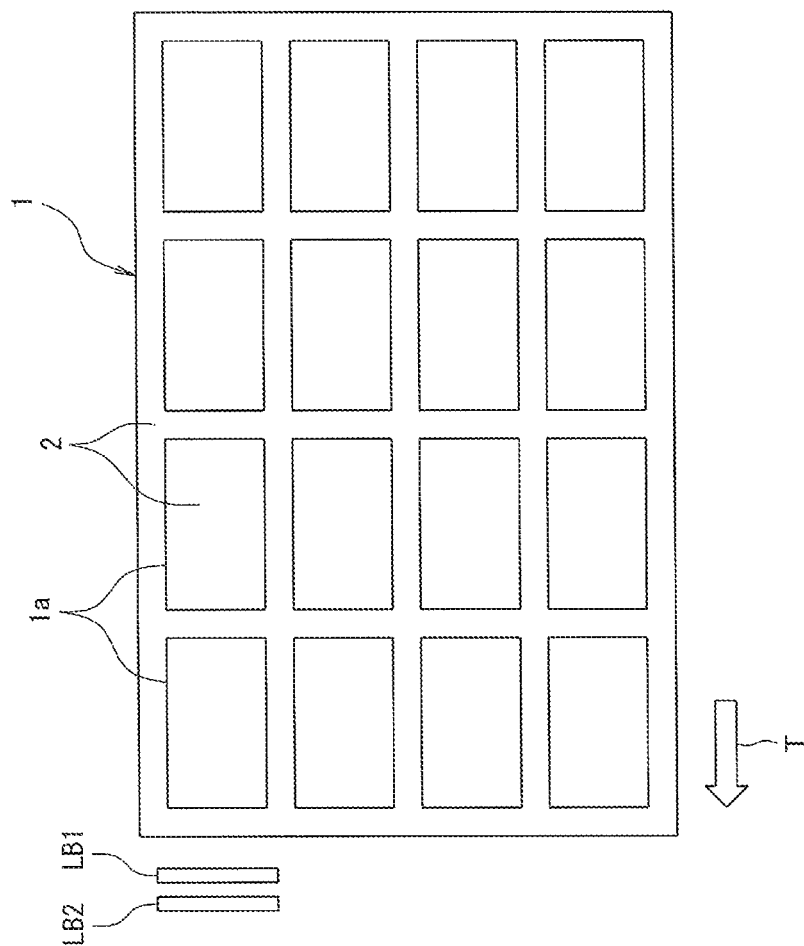
FIG. 2 is an illustrative plan diagram depicting the situation just before the start of the processing in a laser annealing method which is carried out with the laser annealing device according to the embodiment of the present invention.

As depicted in FIG. 2, the first laser beam LB1 and the second laser beam LB2 have beam spots, each beam spot being shaped to have an elongated rectangle-shape elongated over the entirety of a transverse direction of each of the panel regions 1a. The transverse direction of the panel region 1a is perpendicular to a scan-movement direction of the beam spot, i.e., a unidirectional direction opposite to the transport direction T. The beam spots of the first laser beam LB1 and the second laser beam LB2 can move relative to the workpiece 1 in the unidirectional direction opposite to the transport direction T.

As depicted in FIG. 1, the workpiece 1 used in the present embodiment includes an amorphous silicon film 2 resulting from deposition of amorphous silicon on the substrate surface of a glass substrate. This workpiece 1 becomes a crystallized silicon film substrate 1A depicted in FIG. 5 or a crystallized silicon film substrate 1B depicted in FIG. 9 using a laser annealing method to be described later. Each of the panel regions 1a in the workpiece 1 finally becomes a thin film transistor (TFT) substrate having a built-in thin film transistor (TFT) etc.

The first laser beam LB1 has at its beam spot an intensity high enough to transform the amorphous silicon film 2 to a microcrystalline silicon film 2A. The second laser beam LB2 has at its beam spot an intensity high enough to complete the transformation of the amorphous silicon film 2 to a crystallized silicon film in the form of a pseudo-single crystalline silicon film 2B.

Figure 3B:
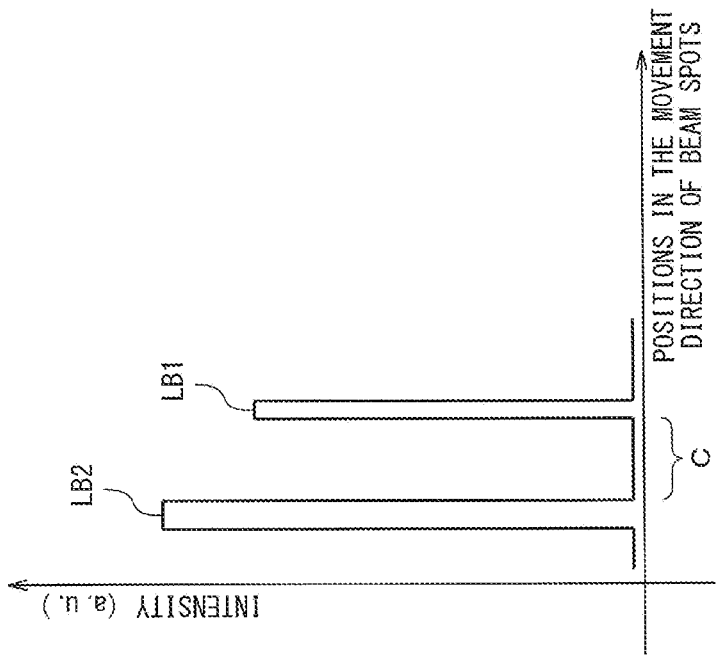
FIG. 3A and FIG. 3B depict the illustrative intensities of a first laser beam and a second laser beam used in the laser annealing device according to the embodiment of the present invention.
Figure 3A:
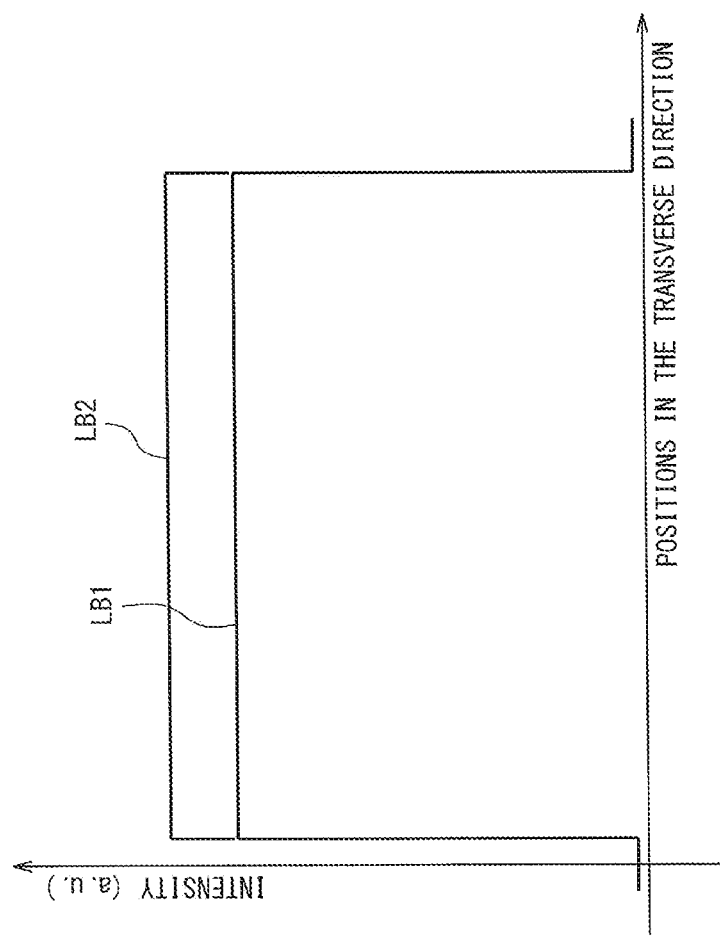

As depicted in FIG. 3A, each of the first laser beam LB1 and the second laser beam LB2 has an intensity profile with excellent uniformity (the deviation within ∓1%) over the entirety of the elongated rectangle-shape beam spot in the transverse direction (i.e., a direction along the long axis of the rectangle-shape of the beam spot).

As depicted in FIG. 2 and FIG. 3B, the beam spot of the first laser beam LB1 and that of the second laser beam LB2 are aligned in a line parallel to the unidirectional direction opposite to the transport direction T and separated by a predetermined distance C. This distance C, which is extremely short, is set appropriately depending on the conditions etc. for action of the first laser beam LB1 and that of the second laser beam LB2.

Figure 4:
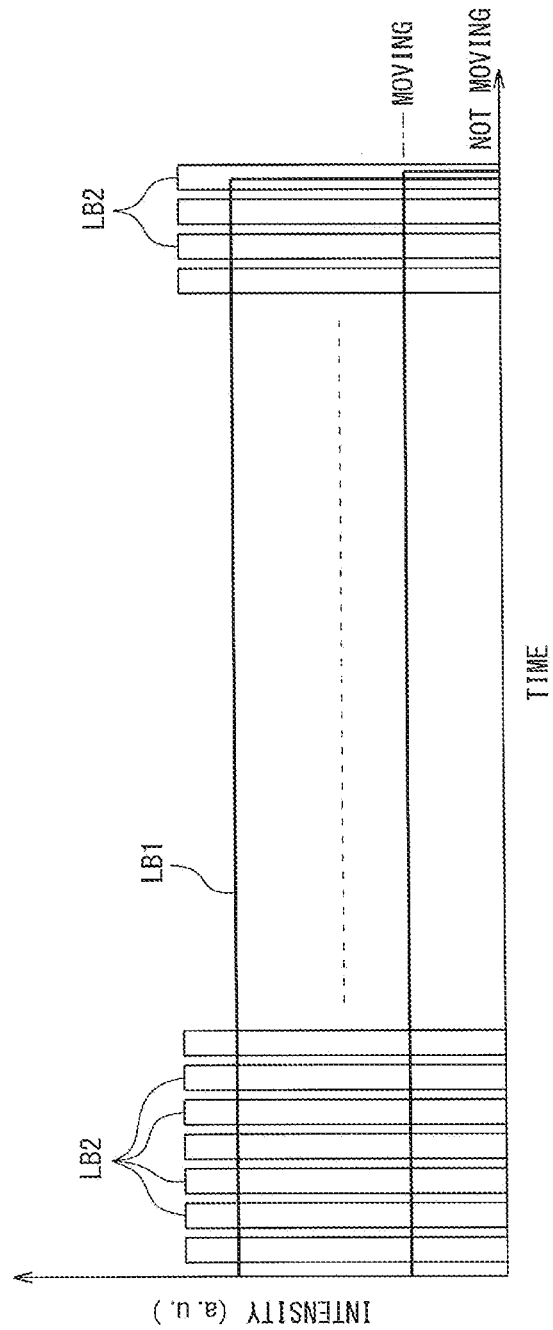
FIG. 4 is an illustrative diagram of the operation of the laser annealing device according to the embodiment of the present invention, showing the timing of laser irradiation of a workpiece with the first laser beam and the timing of laser irradiation of the workpiece with the second laser beam as well as whether the workpiece is moving.

The beam spots of the first laser beam LB1 and the second laser beam LB2 are moved relative to the workpiece 1 in the unidirectional direction opposite to the transport direction T in a way such that the beam spot of the first laser beam LB1 precedes that of the second laser beam LB2. In the present embodiment, the first laser beam LB1 is being continuously switched ON to keep irradiating the workpiece 1 while the workpiece 1 is moving as depicted in FIG. 4. The second laser beam LB2 is switched ON only when its beam spot enters a region reserved for lateral crystal growth of growing crystals to become a pseudo-single crystalline silicon film 2B during the movement of the workpiece 1.

To accomplish this, the controller 14 is programmed to interruptedly switch ON the second laser beam LB2 to irradiate only when its beam spot enters the regions, which are reserved for lateral crystal growth, one after another. In other words, the second laser beam LB2 is interruptedly switched OFF. With the laser annealing device 10 according to the embodiment of the present invention, the laser annealing method depicted in FIG. 4 is carried out, but the laser annealing device 10 may be used to carry out any one of laser annealing methods according to embodiments of the present invention, which are described below.

(Laser Annealing Method)

A laser annealing method according to an embodiment is described below. With the laser annealing method according to the embodiment, the beam spot of a first laser beam LB1 and the beam spot of a second laser beam LB2 are moved relative to an amorphous silicon film 2 in a way such that the beam spot of the first laser beam LB1 precedes the beam spot of the second laser beam LB2 as depicted in FIGS. 1 and 2. As depicted in FIG. 4, the first laser beam LB1 is continuously switched ON to keep irradiating the workpiece 1 while the workpiece 1 is moving as depicted in FIG. 4.

With the laser annealing method according to the embodiment, the second laser beam LB2 is interruptedly switched OFF during the movement of the workpiece 1. In the end, only the first laser beam LB1 is used to irradiate the amorphous silicon film 2 over the period the second laser beam LB2 is switched OFF.

Figure 5:
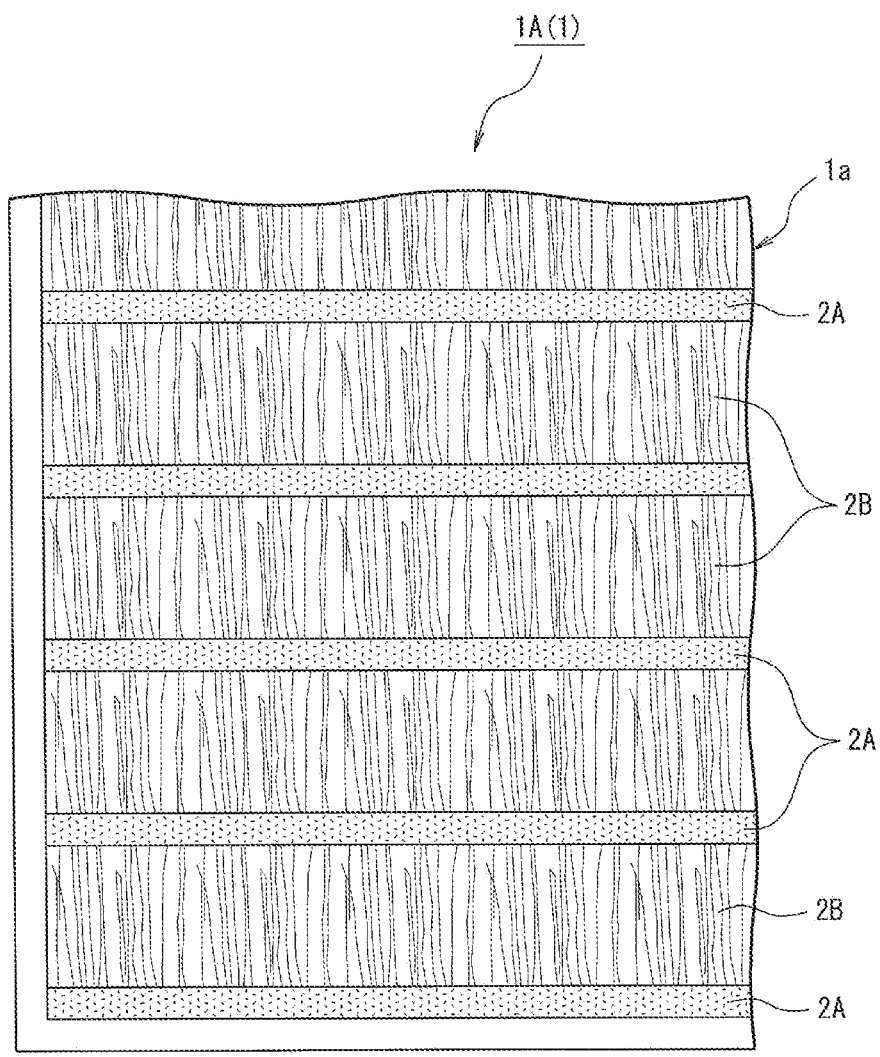
FIG. 5 is a partial plan diagram of a crystallized silicon film substrate resulting from forming a crystallized silicon film on a workpiece using a laser annealing method according to an embodiment of the present invention.

As described, by continuously switching ON the first laser beam LB1 and interruptedly switching OFF the second laser beam LB2 while the workpiece 1 is moving, this laser annealing method can output a crystallized silicon film substrate 1A having panel regions 1a, each being crystallized in a pattern, as depicted in FIG. 5, created by alternately arranging a microcrystalline silicon film 2A and a pseudo-single crystalline silicon film 2B. In the present embodiment, the crystallized silicon film substrate 1A has plural panel regions 1a, but it may have only one panel region.

In the present embodiment, the first laser beam LB1 and the second laser beam LB2 may be pulse width modulated. In the present embodiment, the first laser beam LB1 and the second laser beam LB2 may have different modulated frequencies.

The duration through which the second laser beam LB2 is switched ON, i.e., a length of time from the moment the second laser beam LB2 is switched ON to the moment the second laser beam LB2 is subsequently switched OFF, is not longer than a length of time needed for the workpiece 1 to move along a length of 50 μm lying parallel to the unidirectional direction. This length is a distance between the adjacent two of the microcrystalline silicon films 2A, see FIG. 5, so it is a length along which crystals grow in a direction from one to the other of the adjacent two microcrystalline silicon films 2A to form a crystallized silicon film in the form of a pseudo-single crystalline silicon film 2B.

Each region filled with this pseudo-single crystalline silicon film 2B exhibits small variations in semiconductor characteristics because its lateral crystal growth is uniformly influenced by the crystal structure of the microcrystalline silicon film 2A. This proves to be suitable for a semiconductor layer region of a semiconductor element, e.g., TFT, because, in this pseudo-single crystalline silicon film 2B, mobility is high and variations in semiconductor characteristics are small. Each region filled with microcrystalline silicon film 2A, which serves as a seed crystal film, is not intended for use as a semiconductor layer region of a semiconductor element.

Figure 10:
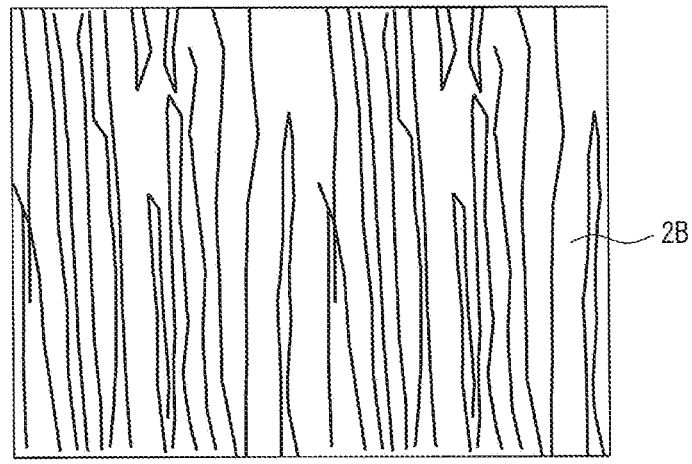
FIG. 10 is an illustrative diagram of the crystal structure of a crystallized silicon film, which is in the form a pseudo-single crystalline silicon film, formed using the laser annealing method carried out by the laser annealing device according to the embodiment of the present invention.

As described, the crystallized silicon film in the form of the pseudo-single crystalline silicon film 2B formed using the laser annealing method according to the embodiment results from the lateral crystal growth brought about by the movement of the beam spot of the second laser beam LB2 from the microcrystalline silicon film 2A, which serves as a seed crystal film. In the embodiment, the second laser beam LB2 especially is intermittently switched OFF during the movement of the workpiece 1 relative to the second laser beam LB2 to reduce the length of the crystal growth in the unidirectional direction to grow crystals for the pseudo-single crystalline silicon film 2B. As depicted in FIG. 10, the crystal structure for the pseudo-single crystalline silicon film 2B, resulting from the lateral crystal growth influenced by the grain boundaries in the seed crystal film in the form of the microcrystalline silicon film 2A, uniformly receives the influence of the grain boundaries in the microcrystalline silicon film 2A. Accordingly, the laser annealing method according to the embodiment proves to be effective in reducing the occurrence of variations in semiconductor characteristics within the pseudo-single crystalline silicon film 2B.

Figure 11:
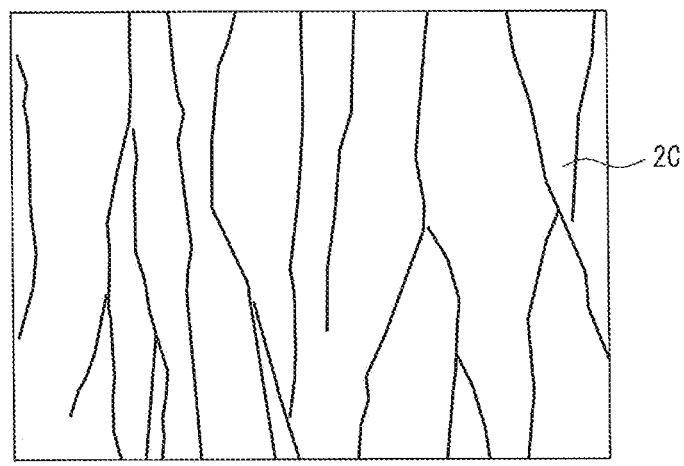
FIG. 11 depicts a reference example, showing the crystal structure of a crystallized silicon film grown in an area separated more than a predetermined distance from a microcrystalline silicon film, which servers as a seed crystal film.

FIG. 11 depicts a reference example of a pseudo-single crystalline silicon film 2C. This pseudo-single crystalline silicon film 2C is produced after carrying out lateral crystal growth in an area separated far, i.e., more than a predetermined distance, from a microcrystalline silicon film 2A, which serves as a seed crystal film. Because the seed crystal film has little influence on the above-mentioned area, exceptionally large crystals and packed grains are found in this area of the pseudo-single crystalline silicon film 2C. If this area is used as a semiconductor layer region of a semiconductor element, variations in semiconductor characteristics are likely to occur.

As described, the laser annealing method according to the embodiment, the laser annealing device according to the embodiment, and the crystallized silicon film substrate 1A or 1B according to the embodiment can reduce the occurrence of variations in semiconductor characteristics of a semiconductor element produced on the crystallized silicon film substrates 1A or 1B.

OTHER EMBODIMENTS

Having described preferred embodiments, the descriptions and the accompanying drawings are not to be understood to limit the scope and sprit of the invention. Many transformations and variations will be apparent to those of ordinary skill in the art without departing from the scope and sprit of the described embodiments.

In the foregoing description about the laser annealing device 10 according to the embodiment, a semiconductor laser exemplifies a cw laser that is operative in cw operation to emit a cw laser beam, but it is not the only one example. Various lasers, e.g., a solid laser, a gas laser, and a metal vapor laser, operative in cw operation may be used. A laser operative in quasi-continuous-wave (quasi-cw) operation to emit a laser pulse having a duration in the range from several hundreds of nanoseconds (ns) to one millisecond may be used as an example of a laser device to emit a cw laser beam.

In the foregoing description about the laser annealing device 10 according to the embodiment, the workpiece 1 is moving in the transport direction T, but the workpiece 1 may stop moving. In this case, the first laser beam LB1 and the second laser beam LB2 are moved relative to the stationary workpiece 1.

In the foregoing description about the laser annealing device 10 according to the embodiment, each beam spot of the first laser beam LB1 and the second laser beam LB2 is shaped to have an elongated rectangle-shape elongated to be broad in its width direction, but the beam spot may be shaped to be narrow in its width direction.

Figure 6:
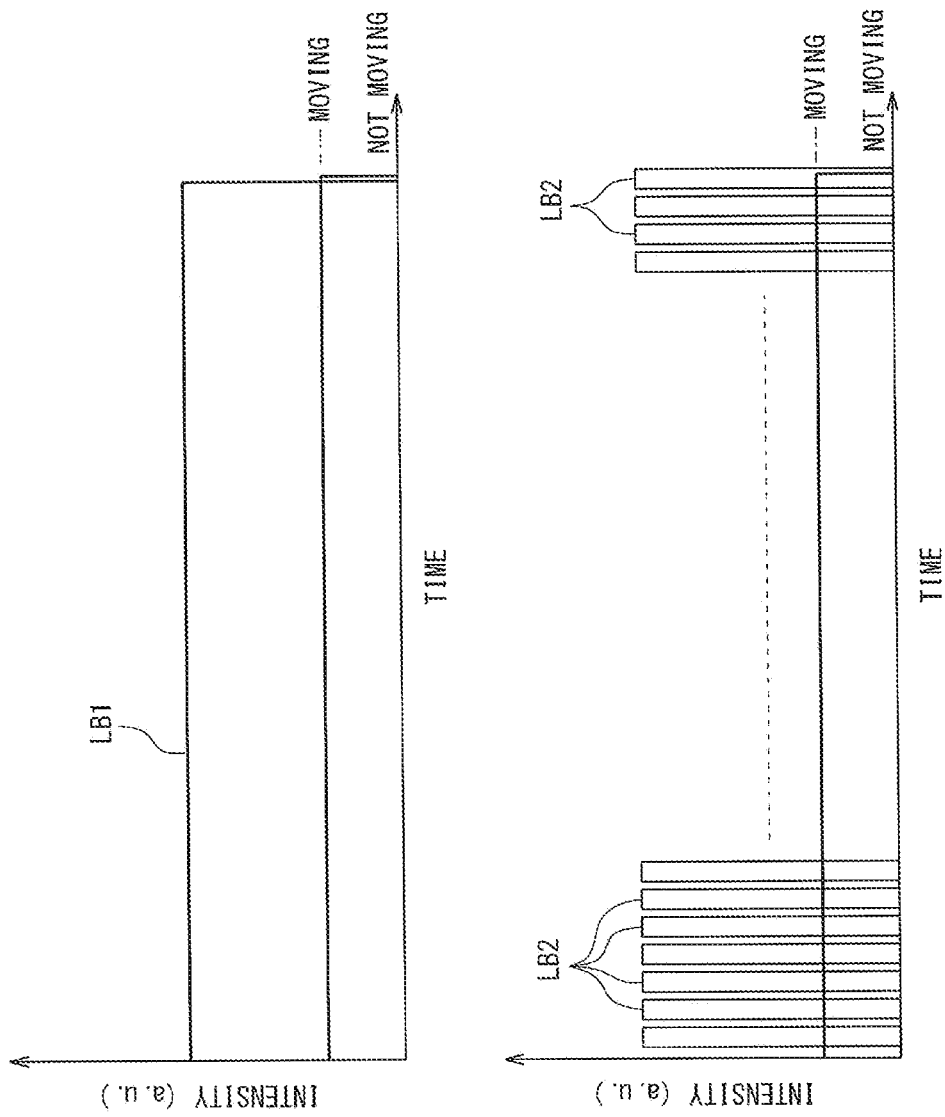
FIG. 6A and FIG. 6B illustrative diagram of the operation of a laser annealing method according to an embodiment of the present invention, FIG. 6A showing the timing of laser irradiation of a workpiece with a first laser beam as well as whether a workpiece is moving, and FIG. 6B showing the timing of laser irradiation of the workpiece with a second laser beam as well as whether the workpiece is moving.
Figure 7:
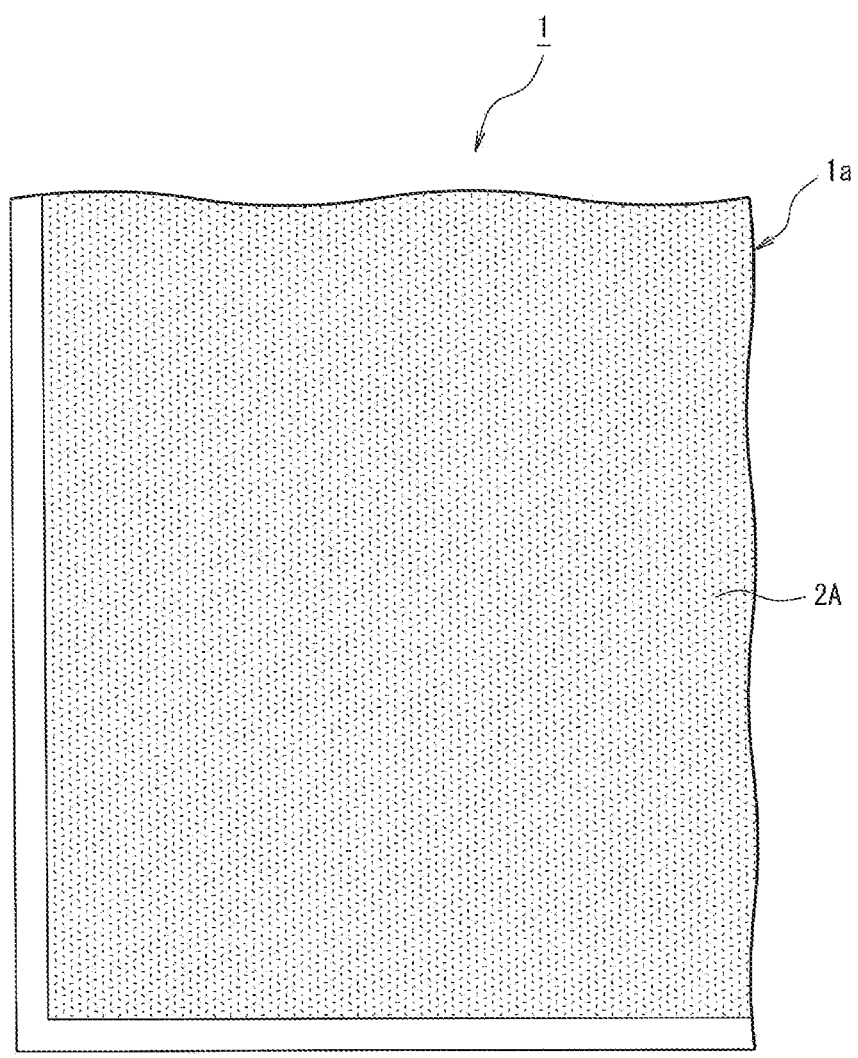
FIG. 7 is a partial plan diagram of a workpiece resulting from transforming the entirety of its amorphous silicon film to a microcrystalline silicon film using the laser annealing method according to the above-mentioned embodiment of the present invention.

In the foregoing description about the laser annealing method according to the embodiment, the laser irradiation with the first laser beam and the laser irradiation with the second laser beam simultaneously take place, but the laser beam irradiation with the second laser beam, see FIG. 6B, may take place after the laser beam irradiation with only the first laser beam, see FIG. 6A. The laser irradiation with only the first laser beam induces deposition of microcrystalline silicon film 2A almost over the entire surface of each panel region 1a depicted in FIG. 7. This is followed by the laser irradiation with the second laser beam to form a crystallized silicon film substrate 1A depicted in FIG. 1A.

Figure 9:
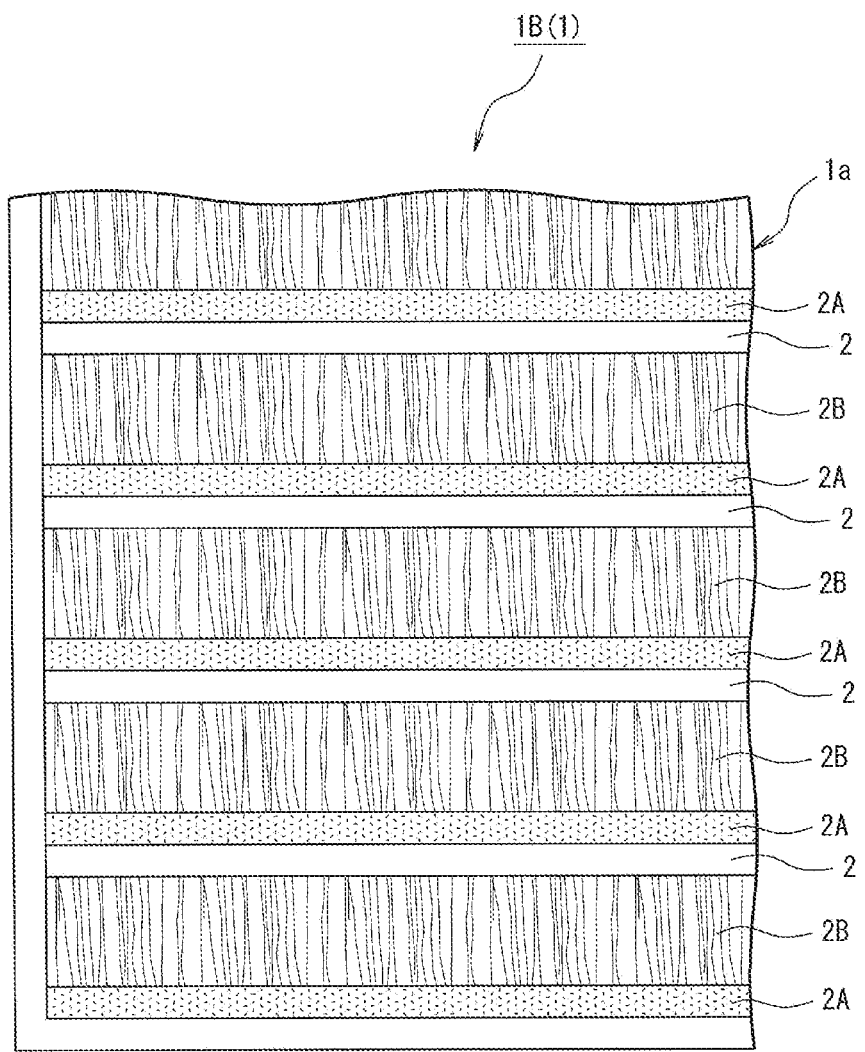
FIG. 9 is a partial plan diagram of a crystallized silicon film substrate formed using the laser annealing method according to the above-mentioned embodiment of the present invention.

In the laser annealing method according to the present invention, the entirety of each of panel regions 1a is interruptedly irradiated with a pulsed second laser beam LB2, see FIG. 8B, after it has been irradiated with a first laser beam LB1 shaped to have a beam spot with a narrow width, see FIG. 8A. In this case, as depicted in FIG. 9, there is formed a substrate structure on which a stripe of amorphous silicon film 2 remains between the adjacent pseudo-single crystalline silicon film 2B and the adjacent microcrystalline silicon film 2A. In a similar manner to the before-mentioned example with reference to FIG. 4, the laser irradiation with the first laser beam as depicted FIG. 8A and the laser irradiation with the second laser beam as depicted FIG. 8B may simultaneously take place.

LIST OF REFERENCE NUMERALS

C Distance
LB1 First Laser Beam
LB2 Second Laser Beam
T Transport Direction (Unidirectional Direction)
1 Workpiece
1A,1B Crystallized Silicon Film Substrate
1a Panel Region
2 Amorphous Silicon
2A Microcrystalline Silicon Film (Seed Crystal Film)
2B Pseudo-single Crystalline Silicon Film (Crystallized Silicon Film with Uniform Characteristic)

2C Pseudo-single Crystalline Silicon Film (Reference Example)
10 Laser Anneal Device
11 First Laser Beam Output Stage
12 Second Laser Beam Output Stage
13 Reflector
14 Controller

The invention claimed is:

1. A laser annealing method for forming a crystallized silicon film after lateral crystal growth of growing crystals in an amorphous silicon film with a technique of moving a laser beam relative to the amorphous silicon film in a unidirectional direction, comprising:
 a first laser beam irradiation of irradiating the amorphous silicon film with a first laser beam for transformation of the amorphous silicon film to a microcrystalline silicon film, wherein the amorphous silicon film is irradiated with the first laser beam to continuously transform the amorphous silicon film to the microcrystalline silicon film along the unidirectional direction, and
 a second laser beam irradiation of carrying out irradiation of a region reserved for the lateral crystal growth of growing crystals with a second laser beam along the unidirectional direction with the microcrystalline silicon film as a starting point for lateral crystal growth of growing crystals constituting the crystallized silicon film, wherein the irradiation with the second laser beam with the microcrystalline silicon film as a starting point is interruptedly carried out along the unidirectional direction,
 forming the microcrystalline silicon film and the crystallized silicon film alternately along the unidirectional direction.

2. The laser annealing method as claimed in claim 1, wherein
 at a minimum, a region reserved for the transformation to the microcrystalline silicon film is irradiated with the first laser beam, and
 only the region reserved for the lateral crystal growth of growing crystals is irradiated with the second laser beam during movement of the second laser beam along the unidirectional direction relative to the amorphous silicon film.

3. The laser annealing method as claimed in claim 1, wherein
 the crystallized silicon film includes an area reserved for a semiconductor element.

4. The laser annealing method as claimed in claim 1, wherein
 the first laser beam and the second laser beam are pulse width modulated.

5. The laser annealing method as claimed in claim 1, wherein
 the first laser beam and the second laser beam have different modulation frequencies.

6. The laser annealing method as claimed in claim 1, wherein
 the first laser beam is a pulsed laser beam, and the second laser beam is a continuous wave laser beam.

7. The laser annealing method as claimed in claim 1, wherein
 the length parallel to the unidirectional direction of the crystallized silicon film is not greater than 50 μm.

* * * * *